United States Patent [19]
Kish et al.

[11] Patent Number: 5,376,580
[45] Date of Patent: Dec. 27, 1994

[54] WAFER BONDING OF LIGHT EMITTING DIODE LAYERS

[75] Inventors: Fred A. Kish; Frank M. Steranka, both of San Jose; Dennis C. DeFevere, Palo Alto; Virginia M. Robbins, Los Gatos; John Uebbing, Palo Alto, all of Calif.

[73] Assignee: Hewlett-Packard Company, Palo Alto, Calif.

[21] Appl. No.: 36,532

[22] Filed: Mar. 19, 1993

[51] Int. Cl.⁵ .................................. H01L 21/20
[52] U.S. Cl. ...................... 437/127; 437/129; 437/130; 437/117
[58] Field of Search ............ 437/127, 129, 130, 905, 437/974, 117, 229; 148/DIG. 135

[56] References Cited

U.S. PATENT DOCUMENTS

| | | | |
|---|---|---|---|
| 4,771,016 | 9/1988 | Bajor et al. | 148/DIG. 135 |
| 4,775,645 | 10/1988 | Kurata et al. | 437/905 |
| 4,846,931 | 7/1989 | Gmitter et al. | 156/633 |
| 4,864,369 | 9/1989 | Snyder et al. | 357/17 |
| 4,864,371 | 9/1989 | Steranka | 357/17 |
| 4,883,561 | 11/1989 | Gmitter et al. | 156/633 |
| 4,902,356 | 2/1990 | Noguchi et al. | 437/127 |
| 4,921,817 | 5/1990 | Noguchi | 437/127 |
| 4,971,925 | 11/1990 | Alexander et al. | 148/DIG. 135 |
| 4,992,837 | 2/1991 | Sakai et al. | 357/17 |
| 5,008,718 | 4/1991 | Fletcher et al. | 357/17 |
| 5,087,585 | 2/1992 | Hayashi | 437/974 |
| 5,110,748 | 5/1992 | Sarma | 437/974 |
| 5,135,877 | 8/1992 | Albergo et al. | 437/229 |
| 5,153,889 | 10/1992 | Sugawara et al. | 372/45 |
| 5,244,817 | 9/1993 | Hawkins et al. | 148/DIG. 135 |

OTHER PUBLICATIONS

Dudley, J. J., et al., "144° C. operation of 1.3 μm InGaAsP vertical cavity lasers on GaAs substrates", Appl. Phys. Lett., 61 (26), Dec. 28, 1992, pp. 3095–3097.
Ishiguro, Hisanori et al., "High efficient GaAlAs light-emitting diodes of 660 nm with a double heterostructure on a GaAlAs substrates", Appl. Phys. Lett., 43 (11), Dec. 1, 1983, pp. 1034–1036.
Pollentier, I. et al., "Epitaxial Lift-off GaAs LEDs to Si for Fabrication of Opto–Electronic Integrated Circuits", Electronics Letters, vol. 36, No. 3, Feb. 1, 1990, pp. 193–194.
Schnitzer, I. et al., "Ultrahigh spontaneous emission quantum efficiency, 99.7% internally and 72% externally, from AlGaAs/GaAs/AlGaAs double heterostructures", Appl. Phys. Lett., 63 (3), Jan. 11, 1993, pp. 131–133.
Sugawara, H. et al., "High-efficiency InGaAlP/GaAs visible light-emitting diodes", Appl. Phys. Lett., 58 (10), Mar. 11, 1991, pp. 1010–1012.

Primary Examiner—Tom Thomas
Assistant Examiner—Kevin M. Picardat

[57] ABSTRACT

A method of forming a light emitting diode (LED) includes providing a temporary growth substrate that is selected for compatibility with fabricating LED layers having desired mechanical characteristics. For example, lattice matching is an important consideration. LED layers are then grown on the temporary growth substrate. High crystal quality is thereby achieved, whereafter the temporary growth substrate can be removed. A second substrate is bonded to the LED layers utilizing a wafer bonding technique. The second substrate is selected for optical properties, rather than mechanical properties. Preferably, the second substrate is optically transparent and electrically conductive and the wafer bonding technique is carried out to achieve a low resistance interface between the second substrate and the LED layers. Wafer bonding can also be carried out to provide passivation or light-reflection or to define current flow.

29 Claims, 13 Drawing Sheets

WAFER BONDING OF LIGHT EMITTING DIODE LAYERS

TECHNICAL FIELD

The present invention relates generally to light emitting diodes and more particularly to methods of fabricating light emitting diodes.

BACKGROUND ART

Light emitting diodes (LEDs) are employed in a wide variety of applications. For example, in optical data transmission, LEDs are used to launch data signals along a fiberoptic cable.

Unlike lasers, LEDs do not generate well-focused beams of light. Rather, an LED radiates light in all directions. That is, the light emission is isotropic. The layers of many conventional LEDs are grown on an optically absorbing substrate having an energy gap less than the emission energy of the active region of the LED. The substrate absorbs some of the light generated within the active region, thereby reducing the efficiency of the device. An example of a prior art aluminum gallium arsenide (AlGaAs) LED of the single heterojunction type is shown in FIG. 1. An epitaxial layer 10 of p-doped AlGaAs and an epitaxial layer 12 of n-doped AlGaAs are grown on a surface of a p-doped gallium arsenide (GaAs) substrate 14. The conduction of current through the junction of the epitaxial layers 10 and 12 will generate light. However, since the energy gap of the absorbing substrate 14 is less than the emission energy, light that is emitted or internally reflected downwardly toward the substrate 14 will be absorbed.

FIG. 2 is a double heterojunction AlGaAs LED on an absorbing substrate 16. An epitaxial layer 18 of n-doped AlGaAs and two layers 20 and 22 of p-doped AlGaAs are grown on the absorbing substrate 16. The bandgaps of the epitaxial layers 18-22 are chosen to cause light to be generated in the active layer 20 and to travel through the epitaxial layers 18 and 22 without being absorbed. However, absorption of light does occur at the substrate 16.

Improved performance can be achieved by employing a transparent substrate that has an energy gap greater than the emission energy of the LED active region. The effect of the transparent substrate is to prevent the downwardly emitted or directed light from being absorbed. Rather, the light passes through the transparent substrate and is reflected from a bottom metal adhesive and reflecting cup. The reflected light is then emitted from the top or the edges of the chip to substantially improve the efficiency of the LED.

There are several techniques for fabricating LEDs having transparent substrates. A first technique is to epitaxially grow the p-n junction on a transparent substrate. However, a problem with this technique is that acceptable lattice matching may be difficult to achieve, depending upon the lattice constant of the LED epitaxial layers. A second technique is to grow the LED epitaxial layers on an absorbing substrate that is later removed. For example, in FIG. 3 the n-doped transparent substrate 24 and the p-doped epitaxial layers 26 and 28 may be epitaxially grown on an absorbing substrate, not shown. The transparent "substrate" 24 is fabricated by growing a thick, greater than 75 μm, optically transparent and electrically conductive epitaxial layer on the lattice-matched absorbing substrate. The other layers 26 and 28 are then grown on the epitaxial "substrate" 24 and the absorbing substrate is removed. Alternatively, the thinner layers 26 and 28 may be grown before the thicker transparent "substrate" 24.

The above-described techniques of fabricating LEDs having transparent substrates suffer from inherent disadvantages. Firstly, epitaxially growing a "thick" optically transparent, electrically conductive "substrate" may not be practical, or even possible, when employing some growth techniques for certain semiconductor materials. Secondly, even when possible, a "thick" epitaxial layer requires a long growth time, limiting the manufacturing throughput of such LEDs. Thirdly, following removal of the absorbing substrate, the resulting LED layer is relatively thin, e.g. approximately 3-6 mils. The thin wafers are difficult to handle without breaking, rendering fabrication more difficult. Moreover, thin wafers create difficulties during mounting the wafers in an LED package. Silver-loaded epoxy is typically utilized for mounting and contacting the bottom of the device. The epoxy tends to flow over the edges of thin wafers, causing the short circuiting of the diode (LED). Also, thin wafers are not as mechanically robust as the devices of FIGS. 1 and 2, which are grown on "thick" substrates of at least 10 mils. Such "thin" LEDs may exhibit increased device-failure problems when mounted in epoxy lamps. Thus, there are contradictory thickness problems when this second technique is employed, since the transparent layer may be "too thick" for practical crystal growth processes and "too thin" for device applications.

Consequently, there may be a tradeoff associated with selection of an absorbing substrate or a transparent substrate. Depending upon the growth and fabrication techniques, an LED having an absorbing substrate may possess mechanical characteristics that are superior to a transparent substrate LED, but the absorbing substrate LED is generally less efficient. Increased efficiency is possible using a transparent substrate; however, lattice mismatch may create difficulties when the epitaxial layers are grown on a transparent substrate having a different lattice constant. In addition, the contradictory thickness problems may be encountered when a "thick" transparent "substrate" is epitaxially grown.

The effect of an absorbing layer or substrate can be minimized by growing a Bragg reflector between the standard LED epitaxial layers and the absorbing substrate. An increase in efficiency is achieved, since the Bragg reflector will reflect light that is emitted or internally reflected in the direction of the absorbing substrate. However, the improvement is limited compared to transparent substrate techniques, because the Bragg reflector only reflects light that is of near normal incidence. Light that differs from a normal incidence by a significant amount is not reflected and passes to the substrate, where it is absorbed. Moreover, LEDs having Bragg reflectors are more difficult to manufacture, since they require the repeated growth of many thin epitaxial layers, typically on the order of 100 angstroms in thickness.

It is an object of the present invention to provide a method of forming an LED having the desirable mechanical characteristics of a "thick" substrate of at least 8 mils and the desirable optical characteristics of a transparent-substrate LED.

SUMMARY OF THE INVENTION

The above object has been met by a method that utilizes a temporary growth substrate optimized for the growth of LED layers, but then provides a performance-enhancing substrate without requiring the epitaxial growth of this substrate. In a preferred embodiment, the performance-enhancing substrate is a transparent member that is joined to the LED layers using wafer bonding techniques. Because the transparent layer is not bonded to the LED layers until completion of epitaxial growth of the LED layers, lattice matching of the transparent substrate and epitaxial layers is not a concern.

The temporary growth substrate is made of a material compatible with fabricating LED layers having desired mechanical characteristics. For example, in order to achieve high crystal quality growth and to optimize lattice matching, standard absorbing substrate materials may be utilized. LED layers are then grown using one or more of a variety of methods, including liquid phase epitaxy, vapor phase epitaxy, metalorganic chemical vapor deposition and/or molecular beam epitaxy. The LED layers that form an LED structure may consist of a light-emitting active layer, upper and lower confining layers, current spreading and light extraction layers and one or more buffer layers, but this is not critical.

Following the growth of the LED structure, the temporary absorbing growth substrate has completed its purpose of allowing the formation of high-quality epitaxial layers. The growth substrate is preferably removed, since the absorbing growth substrate has an energy gap that is less than or equal to the emission energy of the LED structure. Such a relationship between the energy gap and the emission energy of the device would significantly limit the efficiency of the device. While the method of removing the temporary growth substrate is not critical, alternatives include chemical etching, lapping/polishing, reactive ion etching, and ion milling. Removing the growth substrate may further include removal of a portion or all of the layer that contacts the absorbing substrate.

A second substrate is then wafer bonded to the LED structure. In a preferred embodiment the second wafer is electrically conductive and is optically transparent. As compared to the absorbing substrate, the transparent substrate is a performance-enhancing layer. Wafer bonding can occur at the uppermost or lowermost layer of the LED structure. Conventionally, the LED device includes electrodes at opposed ends for properly biasing the p-n junction of the device, so that minimizing the resistivity at the interface of the transparent substrate and the grown layers is important. Utilizing compounds that include indium has been shown to aid in achieving desired ohmic characteristics. In addition to In-bearing compounds, other compounds with a high surface mobility, high diffusivity, and/or superior mass transport properties (e.g., Hg-bearing, Cd-bearing and Zn-bearing compounds) may provide advantages when used in solid-state wafer bonding applications.

One concern with employing the above-described method is that following removal of the temporary growth substrate, the remaining LED structure may be extremely thin, e.g., less than 10 $\mu$m, and therefore fragile and difficult to handle. In a second embodiment, the temporary growth substrate is removed only after attachment of the second substrate to the uppermost layer of the LED structure. Utilizing wafer bonding of the second substrate, rather than epitaxially growing the second substrate, permits attachment of a thick substrate, e.g. 8 mils or more. This second substrate may be transparent and act as a performance-enhancing layer for optical extraction and current spreading and/or act only as a means for obtaining improved mechanical stability during the steps of removing the growth substrate and performing a second wafer bonding of a transparent substrate at the side of the LED structure from which the growth substrate was removed. If only mechanical stability is desired, this second substrate may be subsequently removed after the second wafer bonding step is performed.

While the clearest use of the wafer bonding technique is one in which an optically absorbing substrate is removed and replaced with an optically transparent substrate, this is not critical. The temporary growth substrate may be a transparent substrate having a low electrical conductivity that limits its current spreading ability. Such a substrate would ultimately limit the efficiency of the LED. Thus, removal of the temporary transparent growth substrate for replacement by a transparent substrate having a higher electrical conductivity would improve the performance of the device. Similarly, one absorbing layer having a low electrical conductivity may be replaced with an absorbing layer having a higher electrical conductivity.

The above-described method forms a light emitting semiconductor device having a wafer-bond layer. A "wafer bond layer" is defined herein as a layer or substrate that exhibits the properties that are characteristic of a layer that has undergone wafer bonding. It is believed that one such characteristic is a different nature of misfit dislocations formed at the wafer bonded interface, compared to an epitaxially grown mismatched heterointerface. An interface that has undergone wafer bonding has been observed to exhibit misfit dislocations which primarily consist of "edge dislocations," i.e. dislocations whose Burgers vector lies in the plane of the wafer bonded interface. These properties are in contrast to an epitaxially grown mismatched interface, which typically exhibits a much higher density of "threading dislocations," i.e. dislocations which are not confined to the plane of the mismatched interface and tend to propagate perpendicular to the interface.

In another embodiment of the present invention, layers are epitaxially grown on a first growth substrate that is not necessarily removed at a later time. Many Al-bearing III-V semiconductors are unstable in moist ambients and will undergo degradation by hydrolysis. Such degradation may cause reliability problems for LEDs containing Al-bearing III-V epitaxial layers of significant thickness. For example, an AlGaAs LED such as the one shown in FIG. 3 will undergo significant degradation as a result of oxidation of the high Al-composition layer 28 during wet high-temperature reliability testing. This degradation may potentially be reduced by employing wafer bonding. For example, the majority of the thickness of the high Al-composition layer 28 may be replaced by a thick optically transparent, electrically conductive wafer-bond layer which does not contain a high composition of Al. In like manner, a wafer-bond layer of GaP may be substituted for a major portion of the transparent substrate 24. That is, it is possible to employ the wafer bonding technique to achieve passivation.

In another embodiment, an electrically conductive mirror can be wafer bonded to the LED layers that form the LED structure. Light emitted in the direction of the mirror is then reflected back to the LED structure so as to improve the efficiency of the device. In this embodiment, the mirror is typically supported by a substrate, which may be an absorbing substrate or a transparent substrate, since light does not reach the substrate itself.

Wafer bonding can also be used to provide increased mechanical and/or thermal stability, regardless of any optical benefits. For example, a robust III-V semiconductor wafer or a SiC wafer can be bonded to a II-VI LED structure to add stability.

In yet another embodiment, at least one of the wafer surfaces to be wafer bonded is patterned in a manner to selectively vary the electrical and/or optical properties of the wafer. For example, depressions may be formed at selected areas prior to wafer bonding to define desired current paths to the active region of the LED. Possible applications include, but are not limited to, reducing light directed at metallized electrodes for applying voltages to LEDs and simplifying the fabrication of spot emitters. Patterning may also be used to vary optical properties along the wafer surface, so as to redirect light in a desired manner.

As noted above, the wafer-bond interface is preferably one having a low electrical resistivity and good mechanical strength. It has been discovered that van der Waals' forces are typically ineffective in obtaining the desired ohmic characteristics and structural integrity. It has also been discovered that a combination of pressure and high temperature processing more reliably achieves the desired ohmic and mechanical characteristics. In addition, the application of pressure at high temperatures allows the wafers to conform to each other, minimizing any problems which may result from unevenness of the wafer surfaces, especially for bonding relatively thick layers.

An advantage of the present invention is that the performance of the resulting LED is enhanced. Both light extraction and current spreading can be improved. Another advantage is that a thick substrate of 8 mils or more can be formed in a cost efficient manner, since wafer bonding is not subjected to the limitations of epitaxially growing a substrate. The thick substrate provides improved handling and device mounting characteristics.

BEST MODE FOR CARRYING OUT THE INVENTION

Figure 1:
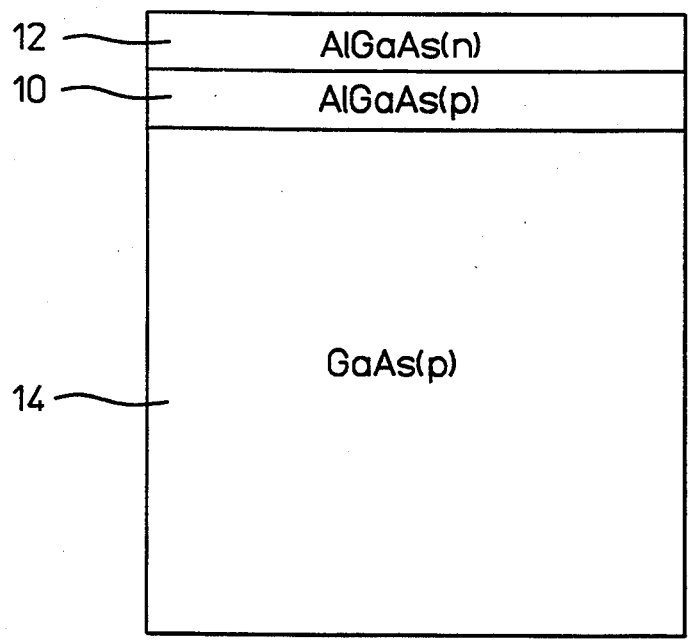
FIG. 1 is a side view of a prior art, single heterojunction LED device having an absorbing substrate.
Figure 2:
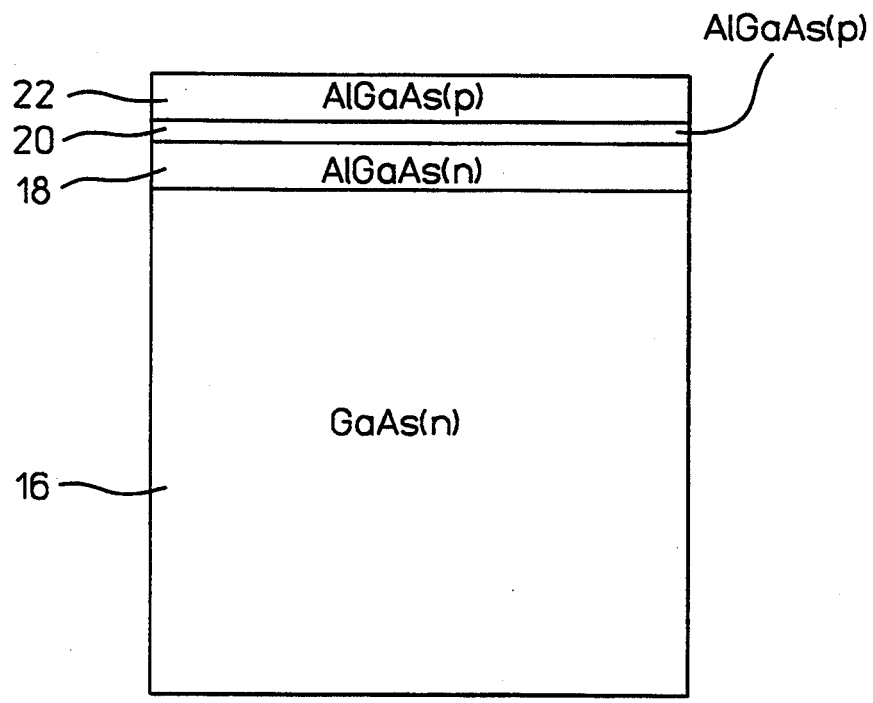
FIG. 2 is a side view of a prior art, double heterojunction LED device having an absorbing substrate.
Figure 3:
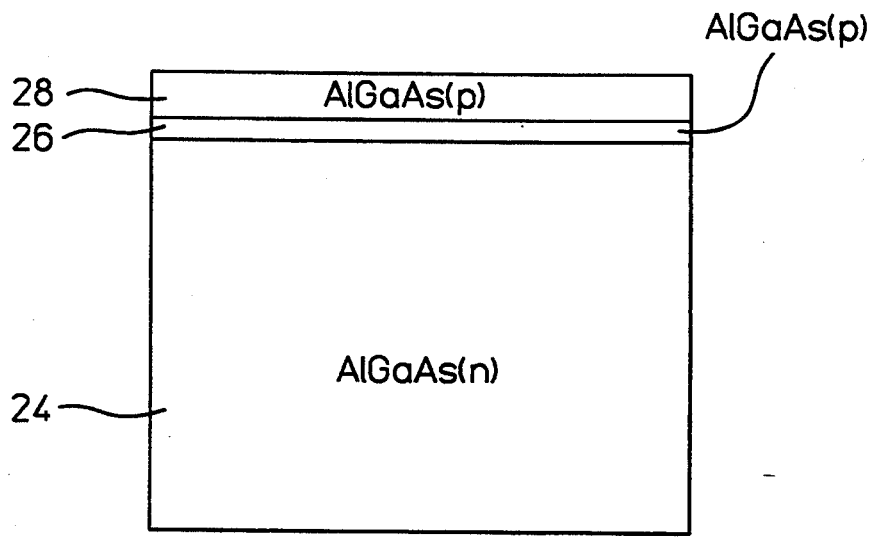
FIG. 3 is a side view of a prior art, double heterojunction LED device having a transparent substrate.
Figure 4:
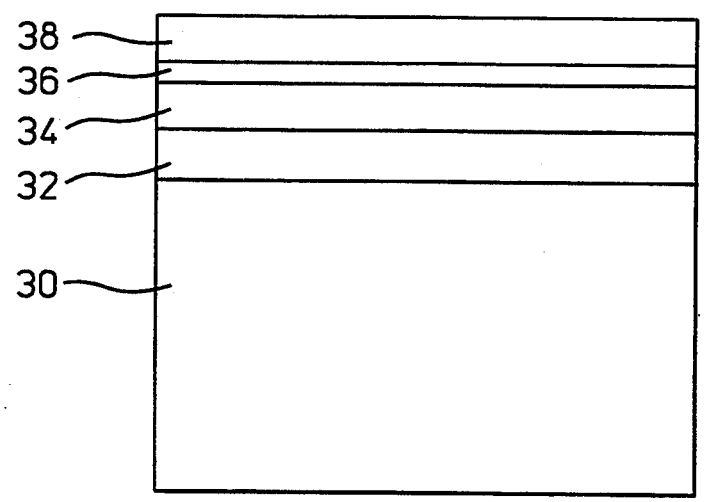
FIG. 4 is a side view of a double heterojunction LED device having a temporary growth substrate in accordance with the present invention.

With reference to FIG. 4, a first step in carrying out the invention is to select a substrate 30 onto which a plurality of LED layers will be sequentially grown. In a preferred embodiment, the substrate 30 is a temporary growth substrate which is removed subsequent to fabrication of the LED layers. In this embodiment the electrical and optical properties of the substrate are irrelevant to the operation of the LED to be fabricated, so that the substrate can be selected solely for properties which affect the growth of the LED layers. For example, lattice matching is typically an important consideration in the selection of the substrate. However, in some embodiments the substrate may remain, so that properties other than growth-compatibility are important to these embodiments.

An exemplary temporary growth substrate 30 is a GaAs substrate within the range of 250 to 500 $\mu$m thick. Four LED layers 32, 34, 36 and 38 are then grown on the growth substrate 30. The layers 32-38 may be grown using any of a variety of known methods, including liquid phase epitaxy, vapor phase epitaxy, metalorganic chemical vapor deposition and molecular beam epitaxy. The layers 32-38 form a double heterojunction LED, but the invention may be utilized with any type of LED device.

The layer 32 directly above the growth substrate 30 is an n-doped buffer layer. Grown above the buffer layer is a lower confining layer of n-doped AlGaInP. The lower confining layer 34 has an exemplary thickness of 800 nanometers.

An active layer 36 of AlGaInP is grown to an exemplary thickness of 500 nanometers. An upper confining layer 38 of p-doped AlGaInP then completes the structure of FIG. 4. The upper confining layer has an exemplary thickness of 800 nanometers. Optionally, a window layer that is transparent and that has a higher electrical conductivity than the layers 34, 36 and 38 may be grown atop the upper confining layer 38 in order to promote current spreading, thereby enhancing the performance of the resulting structure. Such a window layer is described in U.S. Pat. No. 5,008,718 to Fletcher et al.

Figure 5:
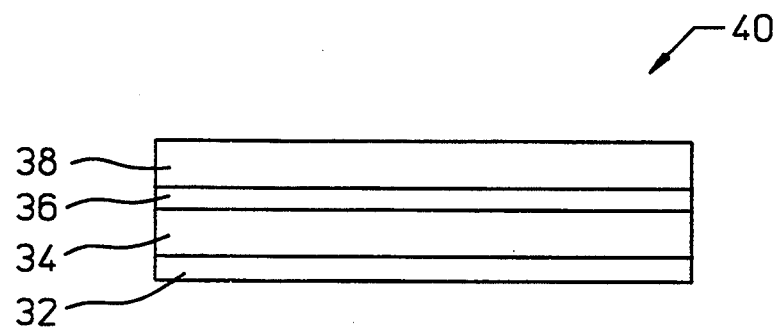
FIG. 5 is a side view of an LED structure having the growth substrate of FIG. 4 removed.

Some degree of optical absorption and electrical resistivity can be tolerated in the grown layers 32-38, since these layers are sufficiently thin that less than optimal characteristics will not seriously compromise device performance. However, an optically absorptive temporary growth substrate 30 will clearly affect performance. Referring now to FIG. 5, the growth substrate has been removed, leaving the LED structure formed by the grown layers 32–38. Removal of the growth substrate can be accomplished in various ways, including chemical etching, lapping/polishing, reactive ion etching, ion milling, or any combination thereof. As will be described more fully below, the method of removing the substrate is not critical so long as a clean, planar surface is presented following the removal. In addition to the growth substrate, the buffer layer 32 may be wholly or partially removed and the lower confining layer may be partially removed.

Following removal of the temporary growth substrate, a performance-enhancing substrate is bonded to either the lowermost layer 32 or the uppermost layer 38 of the LED structure 40 shown in FIG. 5. The location of the wafer to be bonded depends upon the LED structure 40 and the electrical and optical properties of the grown layers 32–38 and/or the substrate to be bonded. A wafer bonding technique is employed. Wafer bonding offers a number of advantages over other methods of providing a performance-enhancing substrate to an LED.

Figure 6:
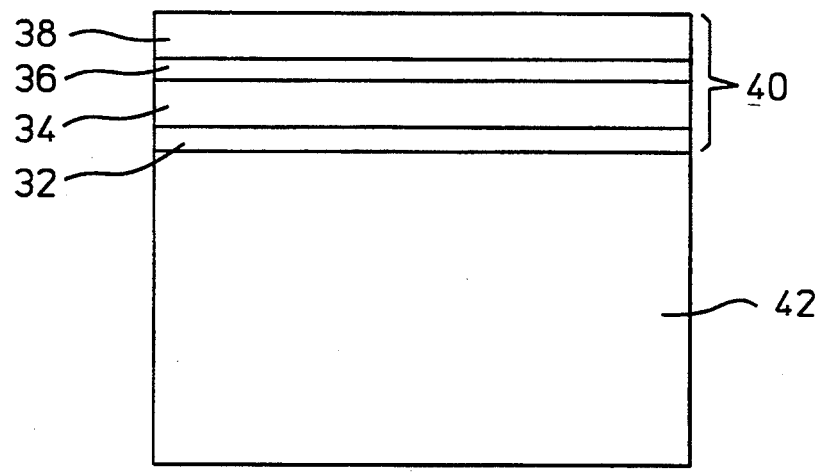
FIG. 6 is a side view of the LED structure of FIG. 5 having a permanent substrate attached using wafer bonding techniques.

FIG. 6 illustrates an embodiment in which an electrically conductive, optically transparent substrate 42 has been wafer bonded to the buffer layer 32. The wafer bonding offers the advantage that a transparent substrate may be provided without requiring the growth of such a substrate. Preferably, the wafer bonded transparent substrate 42 has a thickness exceeding 8 mils. Growing a substrate having a comparable thickness would be difficult or impossible utilizing conventional techniques, and would require an extremely long time. Because only the relatively thin layers 32–38 of the LED structure 40 need to be grown, epitaxial growth times can be drastically reduced, thereby maximizing throughput. Moreover, the wafer bonding process provides a thick device having enhanced mechanical properties, as compared to transparent substrates which are epitaxially grown. Because the resulting LED devices are easier to handle and less susceptible to breakage, fabrication is made easier and device yields are increased. Wafer bonding may also be utilized to displace the p-n junction from the bottom of the device, so as to reduce the possibility of short-circuiting the device when it is mounted in conductive silver-loaded epoxy, as is conventional in the art.

Figure 7:
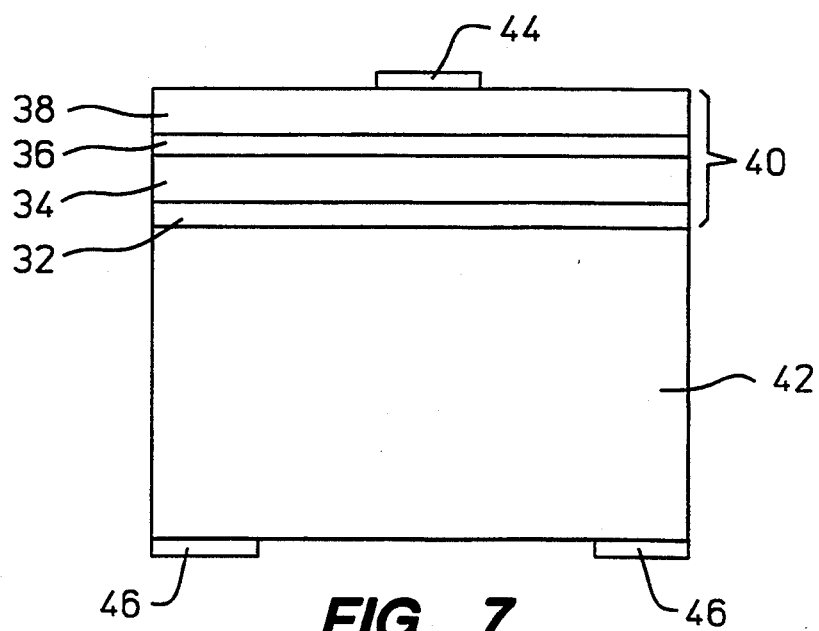
FIG. 7 is a side view of the structure of FIG. 6 having electrodes on opposed sides.

Referring now to FIG. 7, the remainder of the fabrication process involves standard LED techniques. An electrode 44 is formed on the upper confining layer 38, as for example by evaporation. A typical material for forming the electrode is a gold-zinc alloy. A second electrode 46 is formed on the transparent substrate 42. Again, evaporation may be used, but this is not critical. A typical material is gold-germanium alloy.

Figure 8:
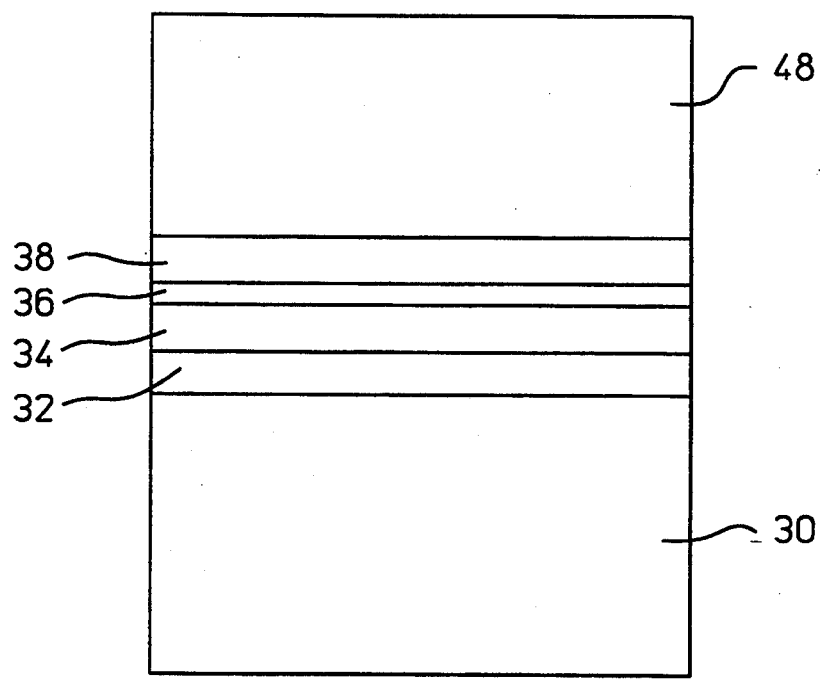
FIG. 8 is a side view of an alternative LED structure fabricated by wafer bonding.

In some circumstances, it may be desirable, or even necessary, to modify the above-described process to accommodate wafer bonding. For example, in FIG. 8 a second substrate 48 has been wafer bonded to the structure of FIG. 4. That is, a second substrate is wafer bonded before removal of the temporary growth substrate 30. Preferably the second substrate 48 is a "thick" layer exceeding 6 mils. Wafer bonding prior to removal of the growth substrate 30 would significantly improve the mechanical stability of the device, since there would be no time in which the epitaxial layers 32–38 would be unsupported by a substrate. Optionally, a buffer layer may be epitaxially grown on the second substrate 48 prior to wafer bonding. Such an epitaxial buffer layer may also be utilized with a substrate that replaces the growth substrate 30 at the bottom of the buffer layer 32.

In another embodiment, the device of FIG. 4 may be a conventional structure having the layers 32–38 grown on a transparent or absorbing substrate 30. The wafer bond layer 48 of FIG. 8 would then be a thick, electrically conductive, optically transparent layer, such as the current-spreading window layer described above with reference to U.S. Pat No. 5,008,718 to Fletcher et al. Furthermore, after bonding the top layer 48, it is also possible to remove the original growth substrate 30 and wafer bond another performance-enhancing substrate to the bottom of the remaining structure for reasons of improving optical extraction and/or current spreading.

Moreover, the device of FIG. 4 may have a conventional transparent layer 30 that possesses a low electrical conductivity, limiting the current spreading ability of the device. In this circumstance, it would be desirable to wafer bond a transparent substrate having a higher electrical conductivity. The increase in electrical conductivity would improve the performance of the device. The substitute transparent substrate should be wafer bonded to the exposed LED layers with low electrical conductivity. The substitute transparent substrate having the higher electrical conductivity could be wafer bonded to the LED structure either before or after removal of the transparent layer with low electrical conductivity.

Similarly, temporary growth absorbing substrates may be replaced with absorbing substrates having a higher electrical conductivity. While the use of wafer bonding to attach an absorbing layer is not the preferred embodiment, such wafer bonding would indeed improve the performance of the LED device.

Figure 9:
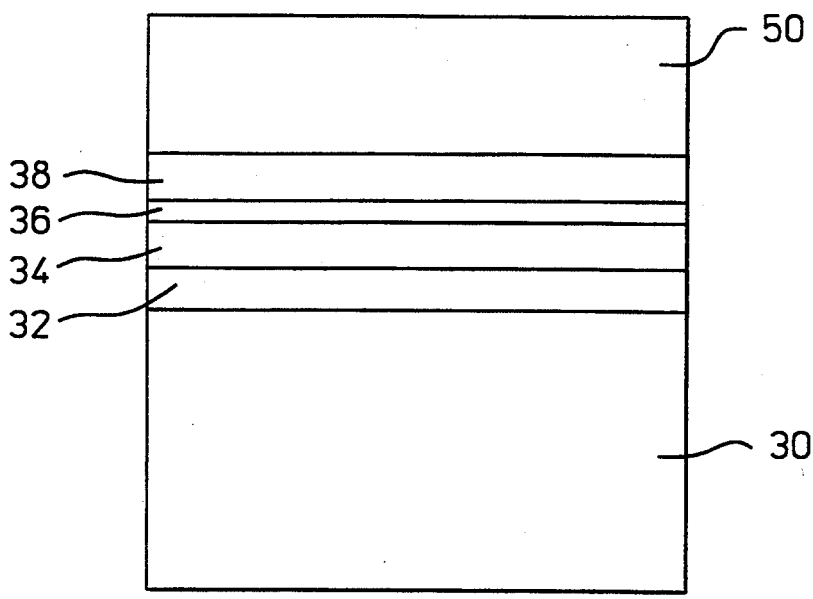
FIG. 9 is a side view of a third embodiment of attaching a wafer-bond substrate to the device of FIG. 4.

Referring now to FIG. 9, wafer bonding may also be employed in providing passivation to the structures of either FIG. 4 or FIG. 6. Many Al-bearing III-V semiconductors are unstable in moist ambients, since such semiconductors are susceptible to degradation by hydrolysis. The degradation may cause reliability problems in LEDs containing Al-bearing III-V epitaxial layers 30–38 of significant thickness. For example, degradation may result from oxidation of the high Al-bearing confining layer 38 during wet, high-temperature use. The degradation can be retarded if the majority of the Al-bearing layer is replaced by a thick optically transparent, electrically conductive wafer bond layer that does not contain a high Al composition. For example, the wafer-bond layer 50 may be GaP.

Returning to FIG. 6, the desired electrical connection between the transparent substrate 42 and the LED structure 40 can be ensured by utilizing a metallization scheme. For example, thin contact areas can be formed on the upper surface of the substrate 42 to be wafer bonded. Corresponding contact areas can be formed on the lowermost layer 32 of the LED structure. Contacts having a thickness of less than 1000 angstroms are preferred. While the pattern of contacts should be sufficiently great to ensure the proper electrical contact, the total area covered by the contact should be sufficiently small that the interface between the LED structure and the substrate 42 allows the passage of light to and from the transparent substrate. The contacts may or may not be alloyed. The surface of the substrate is then brought into contact with the surface of the lowermost layer 32 and the device is annealed at elevated temperatures.

The anneal achieves a wafer bond in the non-metallized areas and provides a bond at the metallized contacts.

Figure 10:
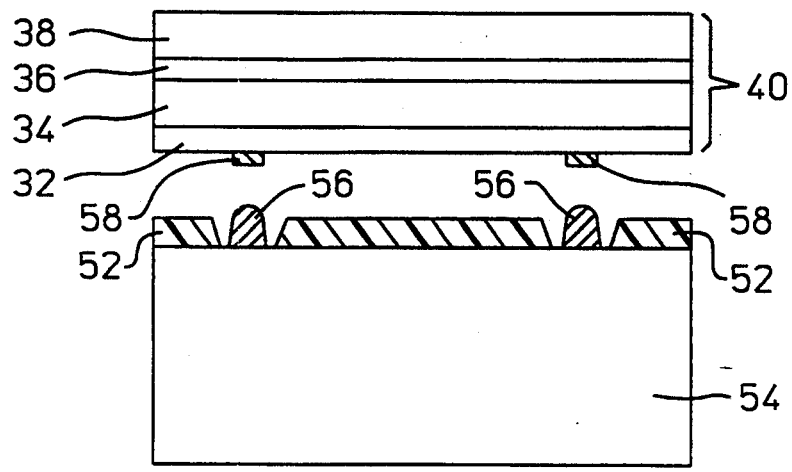
FIG. 10 is a side view of another embodiment of attaching a wafer-bond substrate to the LED structure of FIG. 5.

Superior bonding strength has been observed for semiconductor-glass bonds, as compared to semiconductor-semiconductor bonds. The same is true of semiconductor-$SiO_2$ bonds as compared to semiconductor-semiconductor bonds. Thus, for reasons of mechanical integrity it may be desirable to form transparent substrate LEDs by fabricating a sandwich of semiconductor-glass-semiconductor or a sandwich of semiconductor-$SiO_2$-semiconductor. Referring to FIG. 10, a layer 52 of glass or $SiO_2$ or other oxide can be formed on an optically transparent, electrically conductive substrate 54. The layer 52 is then patterned to provide areas for contact metallization 56, as in the embodiment described immediately above. Alternatively or additionally, an oxide and/or contact metallization 58 may be patterned on the lowermost layer 32 of the LED structure 40. Again, the contacts should be patterned to provide a sufficient area for good electrical contact, while occupying a total area that still renders the interface largely optically transparent. The surface of the layer 52 is then brought into contact with the surface of the buffer layer 32, and treatment forms a wafer bond between the layers. Annealing will enhance the bonding strength between the materials.

Figure 11:
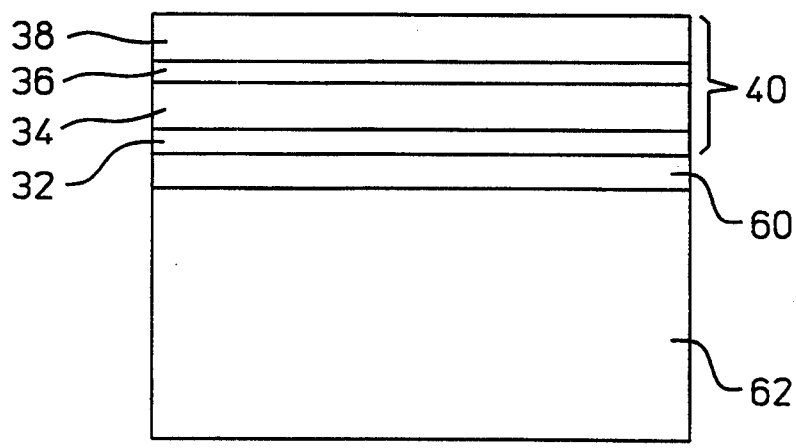
FIG. 11 is a side view of the LED structure of FIG. 5 attached to a mirror by the use of wafer bonding techniques.

Referring now to FIG. 11, the LED structure 40 described above may be wafer bonded to a mirror 60. The mirror 60 will then reflect any downwardly emitted or previously reflected internal light. The reflection will increase the light output of the device. Preferably, the mirror 60 is supported by a substrate 62. The optical properties of the substrate are not relevant, since light is reflected before reaching the substrate.

The mirror 60 and the substrate 62 should be made of electrically conductive material, allowing an electrode to be coupled to the substrate for biasing the LED structure 40. Note that the mirror may also consist of an epitaxially grown or a deposited Bragg reflector. Materials such as silicon, GaAs or even some metals may be employed to form the substrate 62. These materials may provide further improvement of the device, if the device is operated at high temperatures or high currents, since some of these materials, e.g. Si, have a relatively high thermal conductivity.

Figure 12:
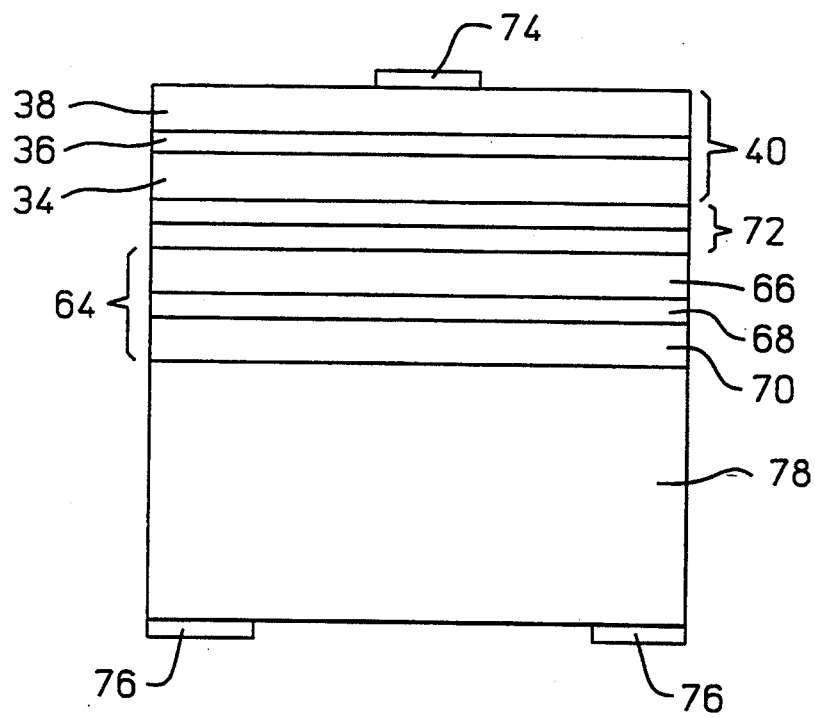
FIG. 12 is a side view of a stacked LED device.

Stacked LED devices may also be formed using the wafer bonding process. Such a device is shown in FIG. 12. Multiple LED structures 40 and 64 may be bonded together and/or bonded to other layers if the interfaces are such that a high electrical conductivity is maintained through the device. The doping type of the layers 34 and 38 of the upper LED structure 40 corresponds to the doping type of the layers 70 and 66, respectively, of the lower LED structure 64. Thus, the two LED structures 40 and 64 are arranged with the same polarity. Also, the surfaces to be wafer bonded should be prepared such that they are very heavily doped. Thus, when the structures are bonded together, a heavily doped tunnel junction 72 having the opposite polarity of the LED structures is formed. Alternatively, the tunnel junction may be epitaxially grown as part of one of the LED structures with wafer bonding occurring to the exposed surface of this junction.

The device of FIG. 12 is operated by applying a voltage at an upper electrode 74 and a voltage at lower electrodes 76 such that the individual LED structures 40 and 64 are forward biased. The lower electrodes are a patterned metallization on an electrically conductive, optically transparent substrate 78. The forward biasing of the stacked device reverse biases the heavily doped tunnel junction 72, causing the tunnel junction to conduct. In this manner, an arbitrary number of LEDs can be stacked together for improved light output and efficiency. The LED device comprised of the stack of LED structures 40 and 64 would operate at the summation of the voltages of the individual LED structures, if the LED structures were not stacked together. It is not critical that the active layers 36 and 68 possess the same emission energy. However, the substrate 78 preferably has an energy gap greater than the emission energies of the individual LED structures. It should be noted that the stack may also be formed if all of the conductivity types are inverted.

Any of a number of substrates can be wafer bonded in the formation of an LED device. In the preferred embodiment, the wafer-bond layer is a semiconductor having a thickness that exceeds 1 mil. Acceptable materials include Si, Ge, AlP, AlSb, GaN, AlN, GaP, GaAs, GaSb, InP, InAs, InSb, ZnS, ZnSe, CdSe, CdTe, SiC, or any combination of alloys of the above. The wafer-bond substrate may be commercially available or may consist of epitaxially grown layers added to a commercially available substrate. The epitaxially grown layers are added for reasons such as increasing the bonding strength of the substrate or the electrical conductivity of the wafer-bond interface. It is also possible that the wafer-bond substrate is solely a thick, i.e., greater than 1 mil, epitaxial layer of the above-listed materials which has been removed from a temporary growth substrate. It is further possible that the wafer bond layer be a thinner, e.g. 2 $\mu$m, epitaxial layer formed on a temporary growth substrate. Such a layer is then wafer bonded and this growth substrate subsequently removed.

Figure 13:
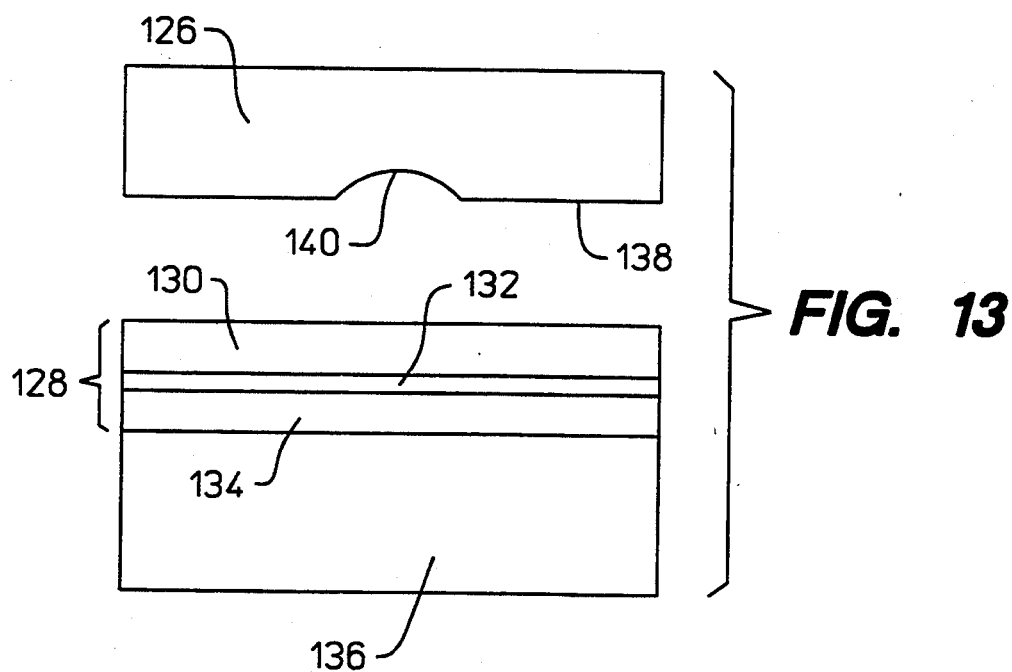
FIGS. 13-17 are side views of LED devices utilizing patterned layers that are wafer bonded.

FIG. 13 illustrates an embodiment in which a patterned semiconductor wafer 126 is wafer bonded to an LED structure 128 comprising an upper confining layer 130, an active layer 132 and a lower confining layer 134. The LED structure may be grown onto a substrate 136, or may be wafer bonded to the substrate 136. The patterned semiconductor wafer 126 may be a current-spreading window layer such as the one described with reference to FIG. 8, but this is not critical. The patterned wafer 126 is etched at a lower surface 138 to form a depression 140. The presence of the depression will cause variations in both the electrical and optical properties when the patterned wafer is joined to the LED structure.

Figure 14:
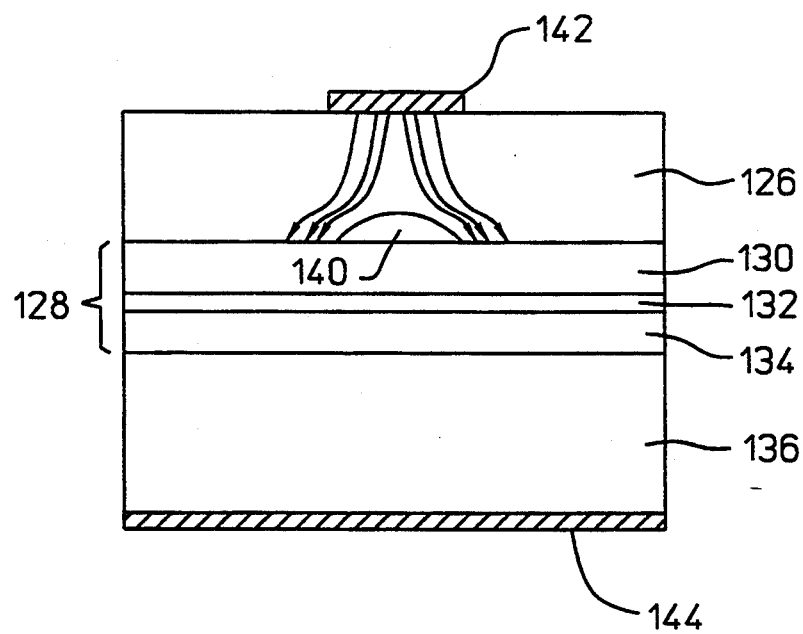

In FIG. 14, the patterned semiconductor wafer 126 has been wafer bonded to the upper confining layer 130 of the LED structure 128. Electrodes 142 and 144 are then formed on the upper surface of the patterned wafer 126 and the lower surface of the substrate 136. The depression 140 in the patterned wafer creates a cavity, or void. The application of a voltage at the electrode 142 will cause the conduction of current to the LED structure 128, but no current will flow to the region directly beneath the cavity, as shown by the current flow arrows in FIG. 14.

Electrode regions are typically absorbing regions. Consequently, restricting current flow in the manner illustrated in FIG. 14 will improve the efficiency of the LED device and provide an uncomplicated method of selecting electrical current flow paths.

Figure 15:
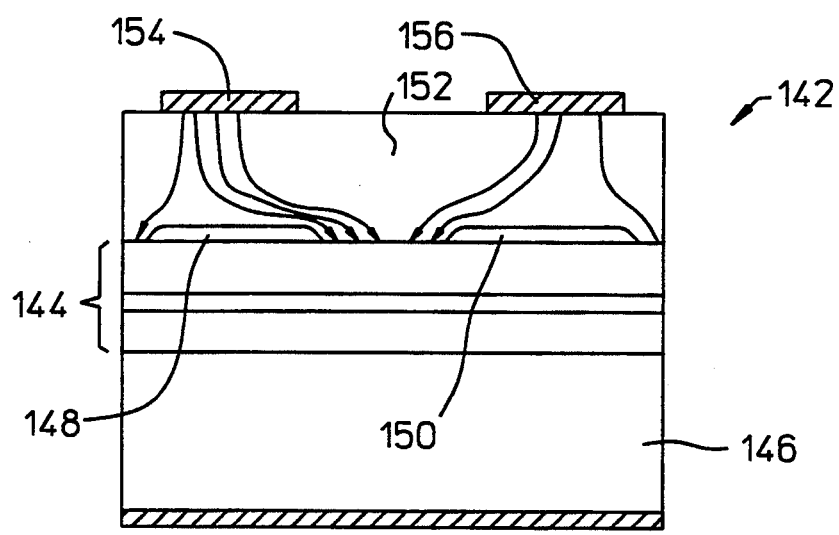

Other LED devices, such as displays and spot emitters, may benefit from restricted current flow. FIG. 15 shows a spot emitter 142 that includes an LED structure 144 on a substrate 146. Depressions 148 and 150 are formed in a wafer-bond layer 152. The cavities at the interface of the LED structure and the wafer-bond layer function to define current flow from electrodes 154 and 156 to the interface. The defined flow path provides a current-injection region between the depressions 148 and 150, since the depressions limit the area of electrical contact at the interface. Current injection and light output at a central region are desirable in such applications as coupling the spot emitter 142 to a fiber optic device. In the preferred embodiment, the depressions 148 and 150 are different portions of a single annular cavity in which the inside diameter defines the central current-injection region.

Figure 16:
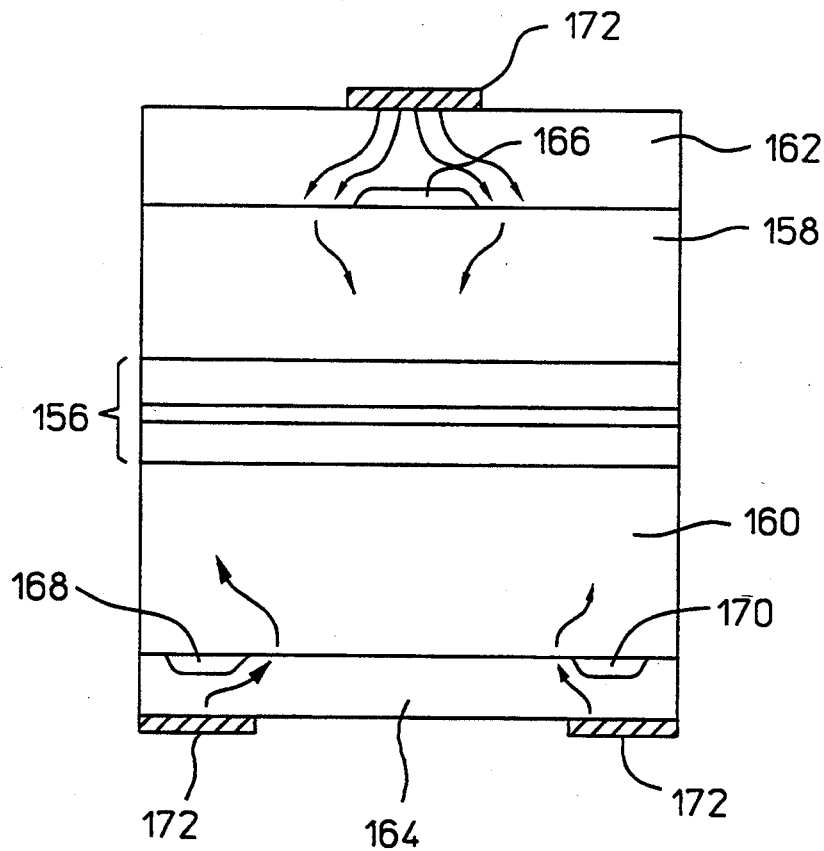

Patterning a semiconductor wafer which is to be wafer bonded may also be employed advantageously to strategically redirect light that has been emitted from LED layers. The redirection of light will depend upon the device geometry, application and mounting. An example is shown in FIG. 16. LED layers 156 are sandwiched between an upper layer 158 and a lower layer 160. Exterior layers 162 and 164 are wafer bonded at opposed sides. Non-bonded regions 166, 168 and 170 are formed sufficiently far from electrodes 172 to allow current to spread around the non-bonded regions. However, the cavities are sufficiently close to the electrodes to redirect light that would otherwise be absorbed by the electrodes. Thus, an increase in light extraction can be realized.

The conduction of current from the electrode 172 to the LED layers 156 is substantially unaffected by the non-bonded regions 166, 168 and 170, but light directed from the LED layers is affected. The redirection of light occurs as a result of a difference in the index of refraction between the non-bonded regions 166–170 and the adjacent layer. The index of refraction of the surrounding semiconductor may be approximately 3, whereas in the cavity it is approximately 1. The exact index of refraction at the non-bonded regions depends upon the semiconductor wafer bonding method. Typically, the bonding occurs in a gaseous environment, such as in $H_2$ or $PH_3$. Thus, a cavity would tend to fill with the gas. Such gases have an index of refraction that is very close to 1 at standard pressure and temperature. The index of refraction of the semiconductor ideally is greater than that of the cavity so that light does not tend to become trapped within the cavity, but this is not critical.

Figure 17:
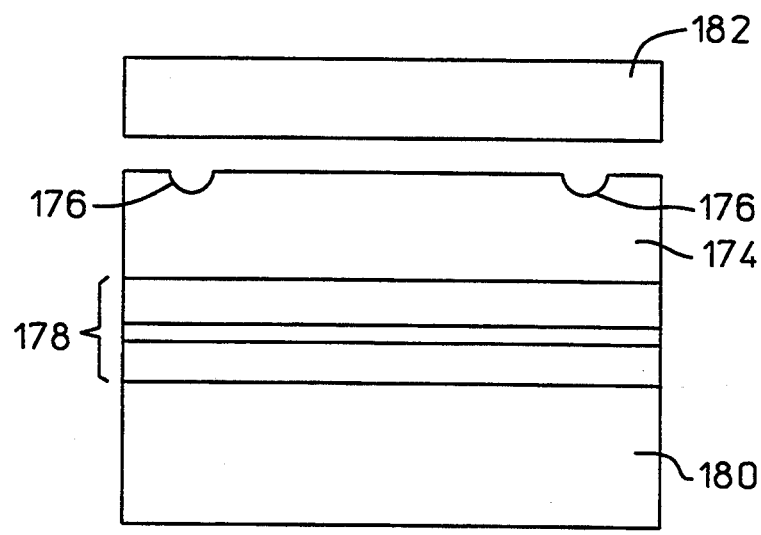

Another means of performing patterned semiconductor wafer bonding for LEDs is to pattern one of the LED layers prior to bonding the LED layers to a patterned or unpatterned substrate. In FIG. 17, a patterned LED layer 174 includes depressions 176. A patterned layer 174 may have been originally epitaxially grown or may have been wafer bonded onto underlying LED layers 178 on a substrate 180. Following formation of the depressions 176, a second substrate 182 is wafer bonded to the upper surface of the patterned LED layer. Alternatively, the LED layer 174 and/or the substrate 182 may be patterned. Furthermore, it is possible to separately wafer bond two layers, at least one of which is patterned, and to then wafer bond the two layers to LED epitaxial layers.

Referring again to FIG. 13, the depression 140 may be formed in the semiconductor wafer 126 by standard etching techniques. Other methods that are well known in the art may also be employed in patterning the surfaces of wafers to be bonded. By example only, other methods would include selective diffusion or ion implantation to form reverse biased buried p-n junctions, the growth or deposition of insulating oxide layers in selective patterns, and any combination of the various available methods. With regard to oxide layers, the index of refraction of most oxides is approximately 1.6, which provides a sufficient index to redirect light in a means similar to the above-described cavities that are formed by etching and wafer bonding.

Wafer bonding a patterned layer has been tested using n-GaP substrates. A patterned n-GaP substrate was bonded to an unpatterned n-GaP substrate using techniques to be described below. The patterned substrate was formed by etching circular depressions having a diameter of approximately 175 $\mu$m and a depth of approximately 15 $\mu$m. The depressions were spaced apart by approximately 125 $\mu$m. For these dimensions, substrate patterning was easily achieved and the bond had sufficient mechanical strength to allow the substrates to be cleaved. Depressions with smaller dimensions, approximately 40 $\mu$m, have also been demonstrated. Extensions to dimensions of less than 10 $\mu$m should also be possible, permitting fine scale current definition and light scattering abilities. Low electrical resistance GaP-GaP bonds and InGaP-GaP bonds for either n-type or p-type unipolar bonds have been achieved using the techniques to be described, so that patterned wafers should be capable of conducting current across bonded regions while preventing current flow across non-bonded cavities.

REDUCTION TO PRACTICE

Figure 18:
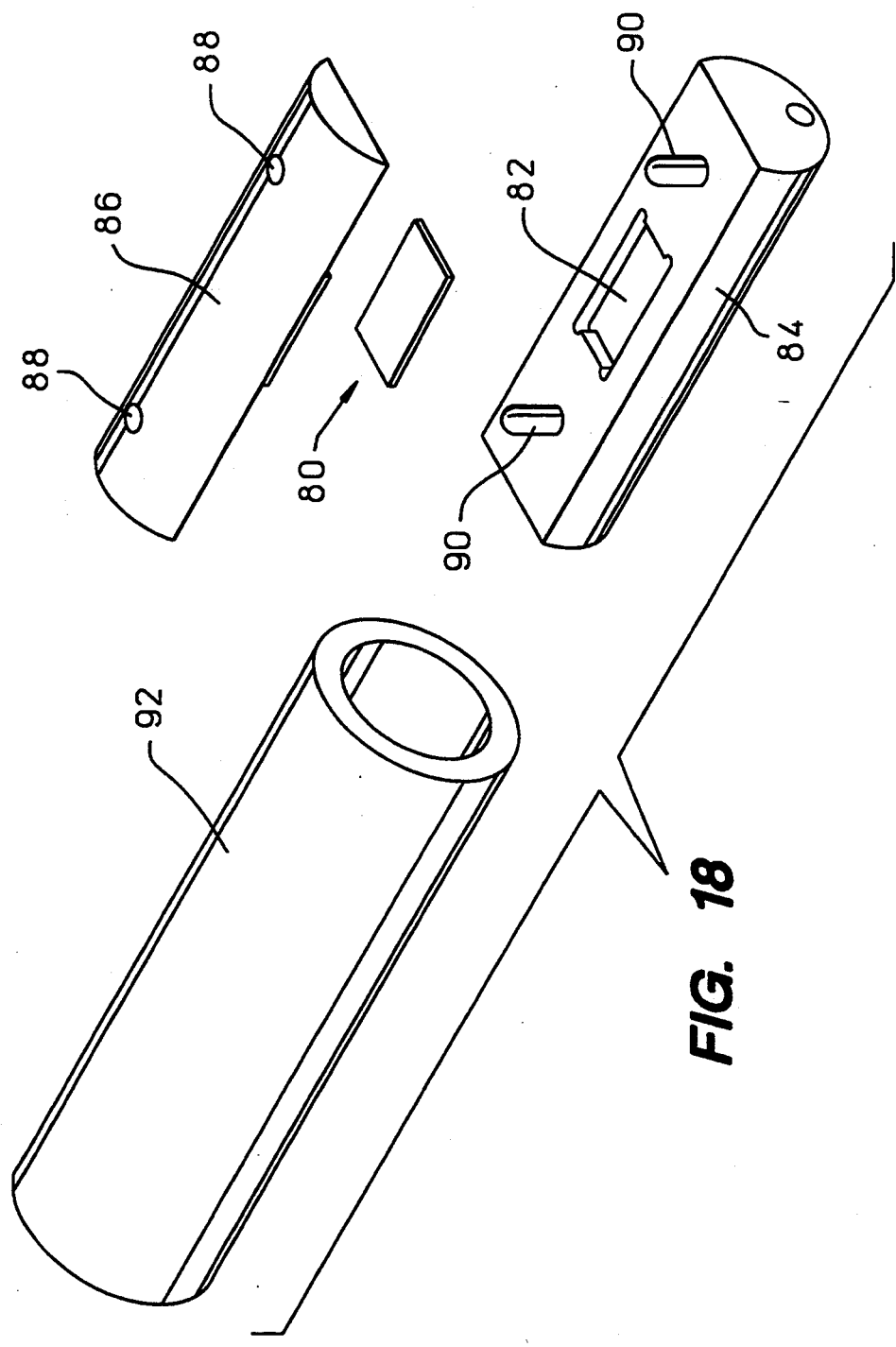
FIG. 18 is an exploded view of a wafer bonding apparatus for carrying out the steps of the present invention.

FIG. 18 illustrates a known device for achieving a wafer bond of a pair of wafers 80. The pair of wafers is placed face-to-face in a recessed area 82 within a first graphite member 84. The recessed area 82 is a 0.5 inch by 0.8 inch area in the first graphite member. A second graphite member 86 includes holes 88 positioned to receive alignment pins 90 projecting from the first graphite member. Graphite shims, not shown, may be placed within the recessed area 82 to compensate for run-to-run variations in the thickness of the pair of wafers 80 to be bonded together.

After the first and second graphite members 84 and 86 have been coupled using the alignment pins 90, the assembly is inserted inside a close-fitting quartz tube 92, which is then loaded into an open-tube furnace. The temperature is raised to 850°–1000° C. in an $H_2$ ambient at a flow rate of 1.0 liter/min. The temperature cycle consists of a ramp to the desired temperature, followed by a five second to one hour anneal. A cooling period then follows.

During heating, the pair of wafers 80 is compressed. The compressional force is developed by the difference in the coefficients of thermal expansion of the quartz tube 92 ($5.5 \times 10^{-7}/°C.$) and the graphite members 84 and 86 ($8.4 \times 10^{-6}/°C.$). Moreover, the coefficient of thermal expansion of the wafers 80 (e.g., $5.8 \times 10^{-6}/°C.$ for GaP) is significant, contributing further to the compressive force. At elevated temperatures, III-V semiconductor wafers become somewhat plastic. Consequently, the wafer surfaces tend to conform to each other when compressed, helping to compensate for any unevenness of the wafer surfaces.

Prior to loading in the wafer bonding apparatus of FIG. 18, the wafers 80 must be cleaned to remove any contamination or any oxides from the wafer surfaces.

Organic contamination is typically removed by degreasing techniques. For the materials $In_xGa_{1-x}P$ and GaP, the oxides are typically removed by etching in $NH_4OH$. After etching, the wafers are immediately placed in methanol to remove any remaining $NH_4OH$ from the wafers. The surfaces to be bonded are placed into contact while the samples are still in the methanol.

The contacting wafers 80 are then removed from the methanol. The methanol quickly evaporates, leaving the wafers 80 bonded by van der Waals' forces. However, the van der Waals' bond does not generally provide sufficient mechanical strength and does not generally provide sufficient electrical conductivity to be employed in LED device fabrication as described above. Thus, further solid-state bonding is required. The wafer bonding apparatus of FIG. 18 is therefore employed.

For the experiments described below, the wafers consisted of GaP:S ($n \sim 5 \times 10^{17}$ cm$^{-3}$) substrates [(100)+2° toward (110), or (100)+10° toward (110)] and of GaP:Zn ($p \sim 2 \times 10^{18}$ cm$^{-3}$) "pseudo-substrates" (prepared from $\sim 2$ mil-thick vapor phase epitaxy GaP grown on GaAs). Also employed were layers consisting of $\sim 1$ μm $In_{0.5}Ga_{0.5}P$:Te ($n \sim 1 \times 10^{18}$ cm$^{-3}$) grown by metalorganic chemical vapor deposition (MOCVD) on GaAs:Te ($n \sim 5 \times 10^{17}$ cm$^{-3}$, and $In_{0.5}(Al_xGa_{1-x})_{0.5}P$ double heterostructure LEDs grown on GaAs by MOCVD. GaAs substrates were oriented (100)+2° toward (110). After solid-state wafer bonding, thermal damage from the exposed surfaces was generally removed by etching in HCl:HNO$_3$:H$_2$O (1:1:1). The wafers were then metallized with AuGe for n-type contacts and/or AuZn for p-type contacts, alloyed, and diced into chips.

It has been discovered that one important consideration in carrying out these steps so as to achieve desired ohmic electric characteristics at the interface of two wafer-bond layers 80 is the surface preparation of the wafers prior to contact. As noted above, the preferred steps include preparing the wafers with an $NH_4OH$ etch, followed by bringing the surfaces to be bonded into contact with each other while the wafers 80 are in a solution of methanol. Wafers that were bonded subsequent to a preparation that included these two steps were compared to wafers that were bonded after the alternative preparation process of an HF:deionized water (1:10) etch, followed by rinsing in deionized water and drying with $N_2$. In both cases the bonded wafers consisted of an n-type GaP substrate and n-type $In_{0.5}Ga_{0.5}P$ (on GaAs:Te). Following the alternative surface preparation processes, the wafers were placed in the wafer bonding apparatus of FIG. 18. The wafers were identically annealed at 1000° C. for one hour. The current-voltage characteristics clearly showed a relatively low resistance ohmic bond for the wafers prepared with $NH_4OH$-methanol. The wafers prepared by etching in HF:deionized water showed non-ohmic characteristics, as if a "barrier" were presented at the interface of the bonded wafer. Such non-ohmic characteristics are generally intolerable for applications in which current is to be passed from one wafer-bonded substrate to another wafer-bonded substrate.

The $NH_4OH$-methanol surface preparation is presently considered to be the preferred preparation for achieving desired ohmic electrical characteristics when bonding n-type InGaP to n-type GaP. Other surface preparations such as $NH_4OH$ etching, rinsing in methanol and then drying with $N_2$ prior to contact result in non-ohmic characteristics. However, the same preparation when applied to bonding n-type $In_{0.5}Ga_{0.5}P$ (on n-type GaAs:Te) to n-type $In_{0.5}Ga_{0.5}P$ (GaAs:Te) resulted in the desired ohmic bonding characteristics. The differences may result from the inability of the surface preparation to remove all of the oxide from the GaP, whereas it is sufficient for the $In_{0.5}Ga_{0.5}P$. Another possible explanation for the differences is that improved bonding properties have been exhibited for In-bearing compounds.

A comparison was made between (a) solid-state bonded wafers consisting of n-type $In_{0.5}Ga_{0.5}P$ bonded to n-type $In_{0.5}Ga_{0.5}P$ and (b) solid-state bonded wafers consisting of n-type $In_{0.5}Ga_{0.5}P$ bonded to n-type GaP. Both sets of wafers resulted in wafer bonds having desirable ohmic electrical characteristics. However, the (a) unipolar n-type $In_{0.5}Ga_{0.5}P/In_{0.5}Ga_{0.5}P$ bond exhibited a significantly lower resistance at the interface as compared to the (b) unipolar n-type $In_{0.5}Ga_{0.5}P$/GaP bond. For (a) the resistance was approximately 1.5 ohms, while for (b) the resistance was approximately 5 ohms (20×20 mil die). Additionally, the lower resistance $In_{0.5}Ga_{0.5}P/In_{0.5}Ga_{0.5}P$ bond was capable of being formed over the entire wafer area at a lower temperature of approximately 975° C., as compared to the $In_{0.5}Ga_{0.5}P$/GaP bond achieved at 1000° C.

The results of the experiments indicate that In-bearing compounds are desirable for solid-state wafer bonding in use with LED fabrication. One possible explanation is that during the semiconductor wafer bonding process, material may be transferred via shear stress, evaporation-condensation, and mass transport. The enhanced bonding observed with In-bearing compounds may be desirable as a result of a higher surface mobility of In atoms compared with Ga atoms or from improved mass-transport properties of $In_{0.5}Ga_{0.5}P$ compared to GaP. In addition, In is known to exhibit a relatively high diffusivity in AlGaAs-GaAs-InGaAs structures. Similarly, the In may diffuse or alloy into the GaP during the solid-state wafer bonding process, forming an $In_xGa_{1-x}P$ (x<0.5) alloy around the bonded interface.

In addition to In-bearing compounds, other III-V or II-VI compounds with similar characteristics, i.e., a high atomic surface mobility and/or improved mass-transport properties, may also be advantageously employed for solid-state wafer bonding. Thus, Hg-bearing, Cd-bearing and Zn-bearing compounds are prime candidates for such applications.

Figure 19:
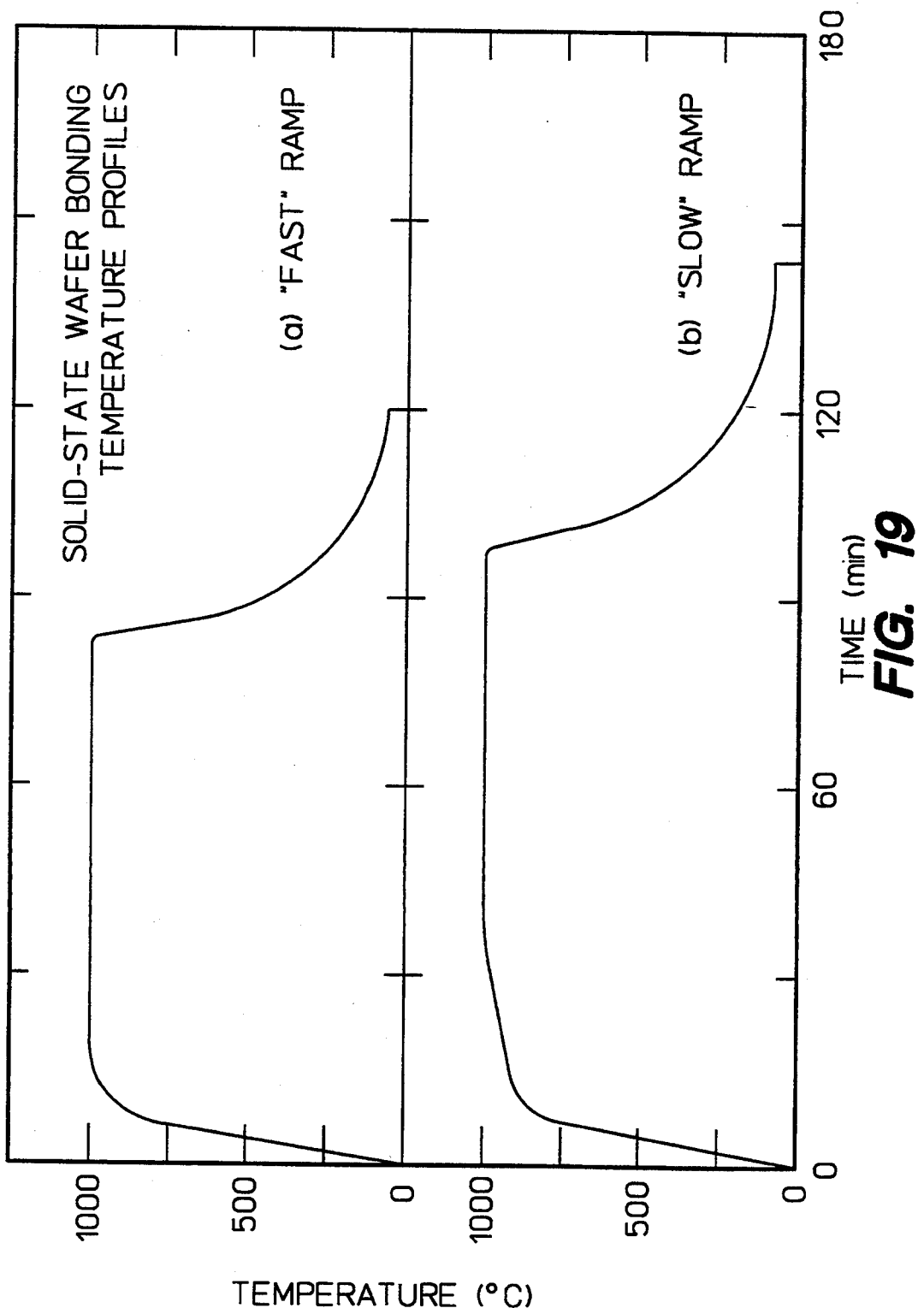
FIG. 19 is a graph of temperature profiles for operating the apparatus of FIG. 18.

Another important parameter to the formation of solid-state wafer bonds with desirable ohmic electrical properties is the temperature profile employed when annealing the wafers 80 in the apparatus of FIG. 18. FIG. 19 shows two different profiles. In the upper profile a "fast" ramp to a temperature of 1000° C. was provided, while in the lower profile a "slow" ramp to 1000° C. was provided. In both cases, an anneal of one hour followed the ramp to 1000° C. Identical cooling profiles are shown.

The lower, "slow" ramp generally resulted in ohmic bonding at lower temperatures and over substantially larger areas. This phenomena may result from the bonded surfaces not being in compression during some portion of the high temperature ramp. This would allow some degree of surface decomposition or thermal oxide desorption prior to wafer bonding. Also, such differences could result from a longer effective anneal provided by the "slow" ramp. However, the effect was only observed in bonding n-type to n-type wafers. No such dependency was observed in bonding p-type to p-type wafers.

There is some evidence that it may be easier to form ohmic bonds between p-type wafers than n-type wafers. Wafer bonding of p-GaP to p-GaP and also of n-GaP to n-GaP was performed. In both cases, the bonding was performed at 1000° C. for one hour. Ohmic bonding occurred over the entire sample areas for both n-type and p-type bonding. However, the bonding resistance was significantly lower for the GaP/GaP p-type unipolar wafer bonds (less than 0.9 ohm) than the GaP/GaP n-type unipolar wafer bonds (approximately 5 ohms) for 12×12 mil chips. The relative ease of forming ohmic bonds between p-type samples may be a result of the higher diffusion rate of p-type dopants compared to n-type dopants.

A marked improvement in light output of approximately a factor of two was achieved by removing the absorbing GaAs substrate and solid-state wafer bonding a transparent GaP substrate to an $In_{0.5}(Al_xGa_{1-x})_{0.5}P$ LED, as compared to the same LED structure with the original growth absorbing GaAs substrate remaining.

Figure 20:
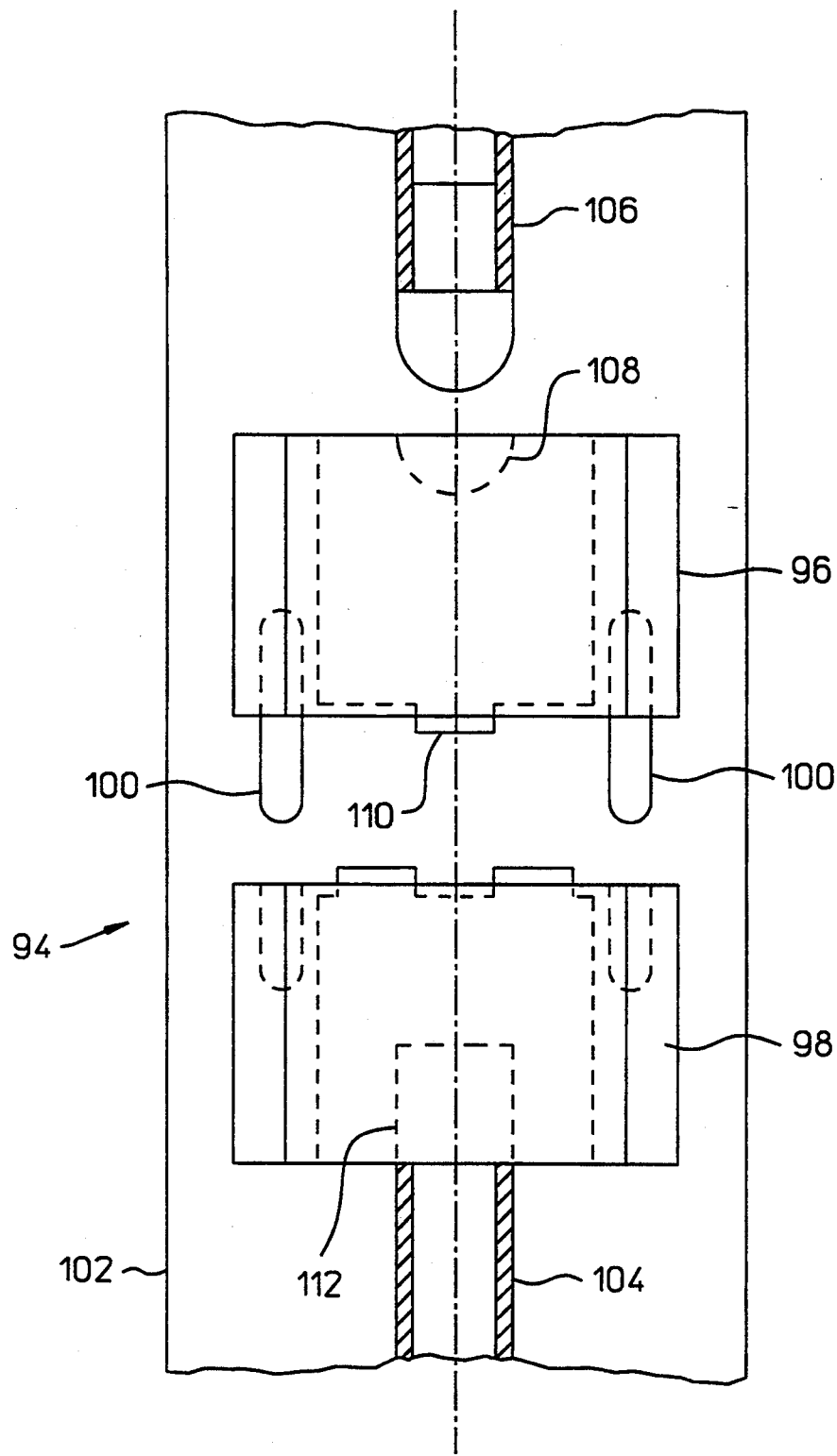
FIG. 20 is a schematic view of an alternate apparatus for carrying out the steps of the present invention.

While the wafer bonding apparatus of FIG. 18 achieves the desired results, the apparatus unfortunately does not permit the application of compressive force independent of temperature. That is, because the apparatus develops compressive force as a result of the thermal expansion of materials, separate control of compression and temperature is not possible. Consequently, a reactor of FIGS. 20 and 21 was developed. FIG. 20 shows a top view of the reactor 94. The reactor includes two graphite members 96 and 98 for compressing a wafer pair. Alignment pins 100 of one graphite member 96 are received within notches of the other graphite member 98.

The graphite members 96 and 98 are located within a furnace tube 102. The rearward graphite member 96 is fixed in position relative to the furnace tube 102 by receiving a shaft 106 in an arcuate opening 108 of the graphite member. The forward graphite member 98 is movable within the furnace tube. An air piston is attached to a shaft 104 that is received within an opening 112 of the graphite member 98. The air piston can be pneumatically controlled to apply a variable pressure to the graphite members, and therefore the wafer pair that is positioned at 110.

Figure 21:
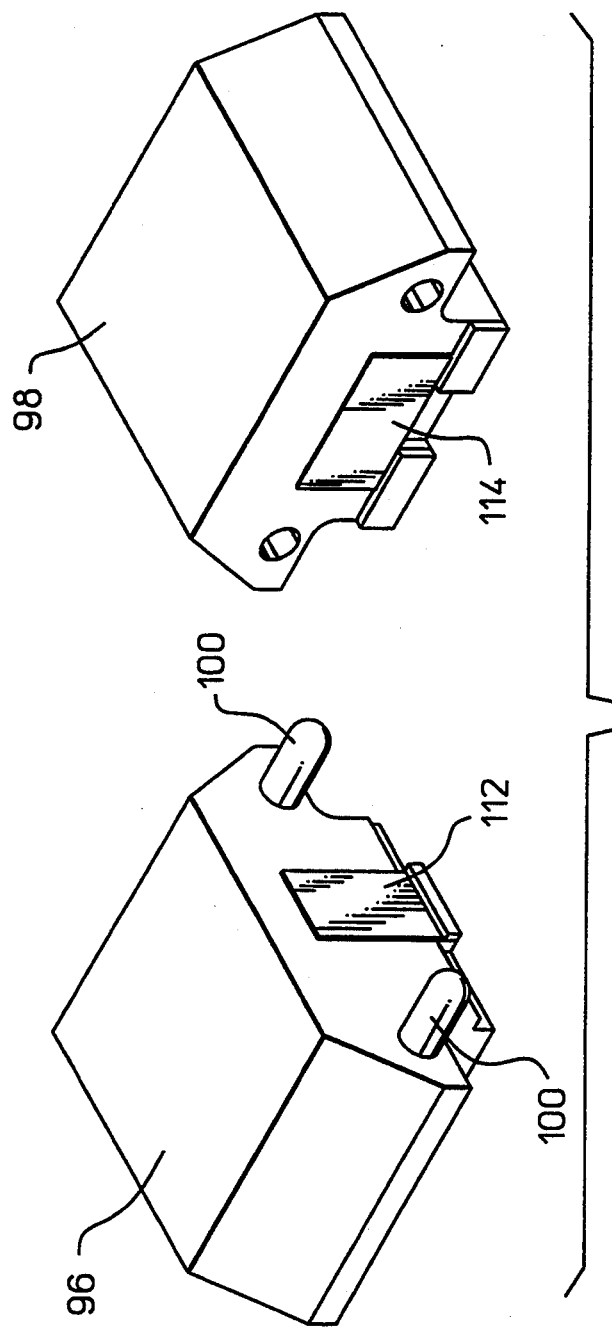
FIGS. 21 and 22 are different embodiments of graphite members for use with the apparatus of FIG. 20.
Figure 22:
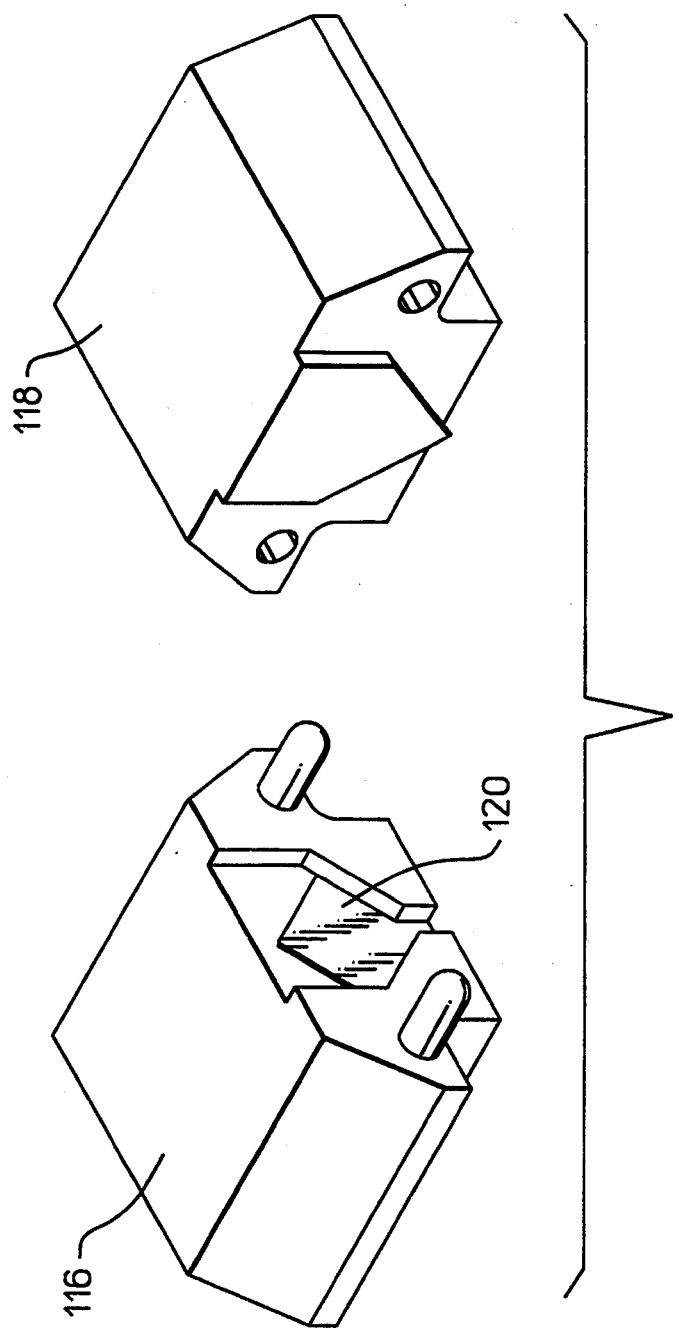

Referring to FIG. 21, the wafer pair 112 and 114 is shown as being initially separated. In comparison, FIG. 22 shows first and second graphite members 116 and 118 in which two wafers 120 are initially in contact. The embodiment of FIG. 22 has been tested and preliminary data indicate that solid-state wafer bonding can be performed over an entire interface. An applied pressure profile as a function of temperature is important to minimizing cracking and breakage of the wafers 120. Cracking may be caused by applying a high pressure at a temperature at which the wafers are not pliable.

The embodiment of FIG. 21, which allows the wafers 112 and 114 to be initially separated, may be preferred, since this embodiment allows thermal desorption of oxides from the wafer surfaces prior to joining the wafers. Additionally, some decomposition of the surfaces to be bonded may be desirable. The embodiment of FIG. 21 would facilitate these bonding conditions.

A further possibility is to separately desorb the oxides from the wafer surface and to cap the surfaces with an As-cap or a P-cap to prevent subsequent oxidation. The capped wafers would then be placed between graphite members. Whether or not the capped wafers are in physical contact may not be critical, since the caps effectively separate the surfaces of the wafers themselves. The capped wafers would then be heated to temperatures exceeding 500° C. to decap the wafers, leaving oxide-free surfaces for bonding. The wafers would then be pressed into contact and the temperature increased for solid-state wafer bonding.

Furthermore, a dopant gas may be flowed through the furnace tube 102 of FIG. 20 during bonding to increase the carrier concentration at the bonded interfaces. Suitable dopant gases may include $H_2Se$, $H_2S$, DETe, and DMZn. This may be especially important for n-type bonding which appears to be more difficult than p-type bonding.

The reactor 94 of FIG. 20 may allow the formation of ohmic solid-state wafer bonds at lower temperatures than required for the apparatus of FIG. 18. Lower temperatures would minimize any layer intermixing of the epitaxial LED layers. More importantly, lower temperatures would minimize the movement of the p-n junction in the device layers.

A further application of the wafer bonding for LED applications consists of bonding a robust semiconductor wafer to less stable semiconductor layers for enhancing mechanical and thermal stability of the wafers. One specific application is for II-VI LED structures, which are generally considered less stable than III-V, IV, or IV-IV semiconductors both with respect to mechanical stress and thermal stress. Consequently, it may desirable to solid-state wafer bond a robust III-V semiconductor or a SiC substrate to a II-VI layer to enhance mechanical and/or thermal stability of the LED device.

We claim:

1. A method of forming a light emitting diode (LED) comprising:
    selecting a first material having properties compatible with fabricating LED layers having desired mechanical characteristics;
    providing a first substrate made of the selected first material;
    fabricating the LED layers on the first substrate, thereby forming an LED structure;
    selecting an optically transparent material compatible with enhancing light-emitting performance of the LED structure; and
    wafer bonding a transparent layer of the selected optically transparent material to the LED layers.

2. The method of claim 1 wherein fabricating the LED layer is a step of epitaxially growing a plurality of layers on the first substrate, the first material being a selection of a material to provide a lattice compatible with epitaxially growing the plurality of layers, said step of epitaxially growing said layers including limiting each layer to a maximum thickness of 75 μm.

3. The method of claim, 1 further comprising removing the first substrate.

4. The method of claim 3 wherein removing the first substrate is a step performed prior to wafer bonding the transparent layer, the wafer bonding being a step of wafer bonding a transparent substrate to a side of the LED structure from which the first substrate is removed.

5. The method of claim 1 wherein wafer bonding the transparent layer to the LED structure is a step performed at elevated temperatures to obtain a low resistance electrical connection, including elevating the temperature to provide softening of the layers to be wafer bonded.

6. The method of claim 5 wherein wafer bonding is a step including applying pressure to the layers to be wafer bonded to achieve conformity of the layers to be wafer bonded.

7. The method of claim 1 wherein at least one of the steps of fabricating the LED layers and selecting the optically transparent material is a step of selecting one of an In-bearing compound, an Hg-bearing compound, a Cd-bearing compound and a Zn-bearing compound at an interface of the layers to be wafer bonded.

8. A method of forming a light emitting diode (LED) comprising:
providing a temporary growth substrate having a lattice compatible with epitaxially growing LED layers;
epitaxially growing a lamination of LED layers on the growth substrate, the lamination having a first side and having a second side coupled to the growth substrate, the growth substrate thereby forming a growth support surface; and
substituting the temporary support surface with a permanent substrate having at least one of a higher electrical conductivity and an increased optical transparency relative to the growth substrate, the substituting including wafer bonding the permanent substrate to one of the first and second sides of the LED layers, the wafer bonding including elevating the temperature at the interface of the permanent substrate and the LED layers the wafer bonding further including applying force to compress the permanent substrate and the LED layers together to achieve a low resistance connection therebetween.

9. The method of claim 8 wherein substituting the temporary support surface includes removing the growth substrate following the wafer bonding of the permanent substrate to the first side of the LED layers.

10. The method of claim 8 wherein substituting the temporary support surface includes removing the growth substrate prior to the wafer bonding of the permanent substrate to the second side of the LED layers.

11. The method of claim 8 further comprising wafer bonding a second electrically conductive, optically transparent substrate on the LED layers, the permanent substrate being electrically conductive and optically transparent, thereby sandwiching the LED layers between transparent substrates.

12. The method of claim 8 further comprising flowing a dopant gas during the wafer bonding of the permanent substrate so as to increase carrier concentration at the interface of the wafer bond.

13. The method of claim 8 further comprising applying a cap material to at least one of the permanent substrate and the LED layers to retard oxidation prior to the step of substituting the temporary support surface with the permanent substrate, the method further comprising applying heat to decap the at least one of the permanent substrate and the LED layers for the wafer bonding of the permanent substrate to the LED layers.

14. A method of forming a light emitting diode (LED) comprising:
providing a first substrate;
epitaxially growing a plurality of layers, including active p-n junction layers for generating light in response to the conduction of current, the layers including at least one aluminum-bearing semiconductor layer; and
wafer bonding an optically transparent and electrically conductive passivation layer onto the aluminum-bearing semiconductor layer, thereby retarding the occurrence of hydrolysis within the aluminum-bearing semiconductor layer.

15. The method of claim 14 wherein the wafer bonding is a step performed such that desired ohmic characteristics are exhibited at the interface of the passivation layer and the aluminum-bearing semiconductor layer.

16. A method of forming a light emitting diode (LED) comprising:
providing a temporary growth substrate, including selecting the growth substrate to be compatible with lattice matching for the fabrication of LED layers;
growing the LED layers on the growth substrate, the LED layers having a first side and having a second side joined to the growth substrate; and
wafer bonding an electrically conductive mirror to one of the first and second sides of the LED layers to reflect light emitted in the direction of the mirror, including elevating the temperature of the LED layers and the mirror during the wafer bonding such that a low resistance connection is achieved.

17. The method of claim 16 further comprising removing the growth substrate, the removal of the growth substrate occurring prior to the wafer bonding where the mirror is wafer bonded to the second side of the LED layers.

18. The method of claim 16 wherein the mirror is supported on a second substrate.

19. A method of stacking light emitting diodes (LEDs) comprising:
epitaxially growing first LED layers to form a first LED structure;
epitaxially growing second LED layers to form a second LED structure;
stacking the first LED structure onto the second LED structure, thereby providing an interface between the first and second LED structures; and
forming an electrical connection between the first and second LED Structures at the interface, including wafer bonding the first LED structure to the second LED structure.

20. The method of claim 19 wherein said first LED layers are grown on a temporary growth substrate, the method further comprising removing the temporary growth substrate.

21. The method of claim 19 wherein wafer bonding includes aligning the first and second LED structures such that said first and second LED structures have the same polarity.

22. The method of claim 19 wherein epitaxially growing the first and second LED layers and wafer bonding the first and second LED structures defines a tunnel junction at the interface of the first and second LED structures, the tunnel junction having a polarity opposite to the first and second LED structures.

23. A method of forming a light emitting diode (LED) having a plurality of layers including adjacent first and second layers joined at an interface, the method comprising the steps of:
patterning a first surface of the first layer such that at least one of the optical and electrical properties will selectively vary along the interface of the first and second layers; and wafer bonding the first surface of the first layer to the second layer.

24. The method of claim 23 further comprising epitaxially growing LED layers, patterning the first surface of the first layer including selecting a pattern to define a desired electrical current path to the epitaxially grown LED layers.

25. The method of claim 23 wherein patterning the first surface of the first layer includes removing material from the first layer to form a depression along the first surface.

26. The method of claim 25 further comprising forming an electrode aligned with the depression for applying a voltage, the electrode being positioned at a side of the first layer opposite to the second layer.

27. The method of claim 23 wherein the first layer is selected of a material to form a current spreading window layer.

28. The method of claim 23 wherein patterning the first surface includes selecting a pattern to define a light reflection pattern for light generated by the LED.

29. A method of forming a light emitting diode (LED) comprising:

providing a first substrate;

providing a II-VI LED structure on the first substrate; and wafer bonding one of a III-V semiconductor substrate and a SiC substrate to the II-VI LED structure, thereby enhancing stability of the II-VI LED structure.

* * * * *